US 7,972,190 B2

(12) United States Patent
Uchida et al.

(10) Patent No.: US 7,972,190 B2
(45) Date of Patent: Jul. 5, 2011

(54) ORGANIC ELECTROLUMINESCENT DEVICE, METHOD FOR PRODUCING ORGANIC ELECTROLUMINESCENT DEVICE, AND ELECTRONIC APPARATUS

(75) Inventors: Masahiro Uchida, Chino (JP); Hideyuki Kimura, Chichibu (JP)

(73) Assignee: Seiko Epson Corporation, Tokyo (JP)

( * ) Notice: Subject to any disclaimer, the term of this patent is extended or adjusted under 35 U.S.C. 154(b) by 168 days.

(21) Appl. No.: 12/329,679

(22) Filed: Dec. 8, 2008

(65) Prior Publication Data

US 2009/0153043 A1 Jun. 18, 2009

(30) Foreign Application Priority Data

Dec. 18, 2007 (JP) ................................. 2007-325591
Sep. 18, 2008 (JP) ................................. 2008-238966

(51) Int. Cl.
*H01J 9/24* (2006.01)
(52) U.S. Cl. .......................................... 445/24; 313/504
(58) Field of Classification Search .................. 313/504; 445/24; 438/29, 39; 216/5, 25
See application file for complete search history.

(56) References Cited

U.S. PATENT DOCUMENTS 5,854,088 A * 12/1998 Plais et al. ...................... 438/39
2006/0278945 A1 * 12/2006 Sakurai ........................ 257/433

FOREIGN PATENT DOCUMENTS

JP A-2007-242436 9/2007

* cited by examiner

*Primary Examiner* — Joseph L Williams
*Assistant Examiner* — Andrew J Coughlin
(74) *Attorney, Agent, or Firm* — Oliff & Berridge, PLC

(57) ABSTRACT

A method for producing an organic electroluminescent device includes forming a first electrode configured to partially cover a substrate, forming an organic light-emitting layer configured to cover the first electrode, forming an optically transparent second electrode that lies on a side of the organic light-emitting layer opposite the side adjacent to the first electrode and is superposed on a current-carrying portion of the first electrode in plan, forming a third electrode in at least part of a region that is not superposed on the current-carrying portion in plan, the third electrode being electrically connected to part of the second electrode, forming an optically transparent protective layer configured to cover at least a region of the second electrode where the second electrode is not superposed on the third electrode in plan, and removing part of the organic light-emitting layer with the third electrode and the protective layer serving as a mask.

11 Claims, 13 Drawing Sheets

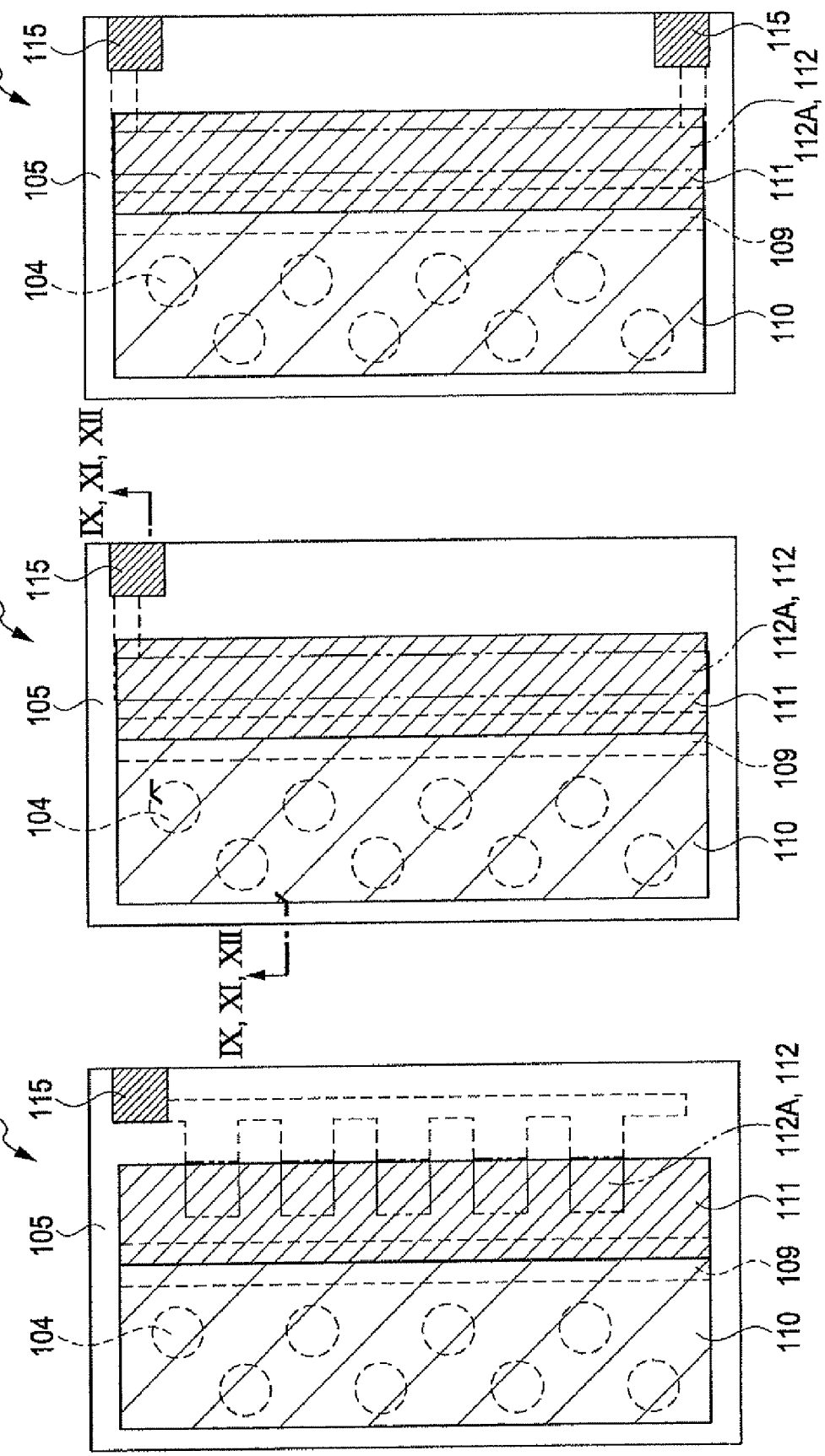

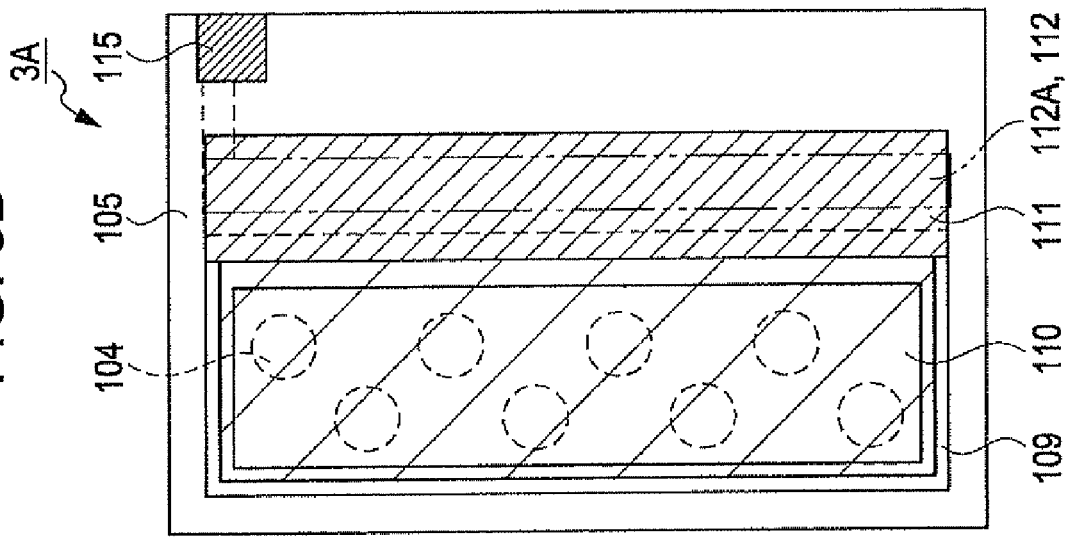
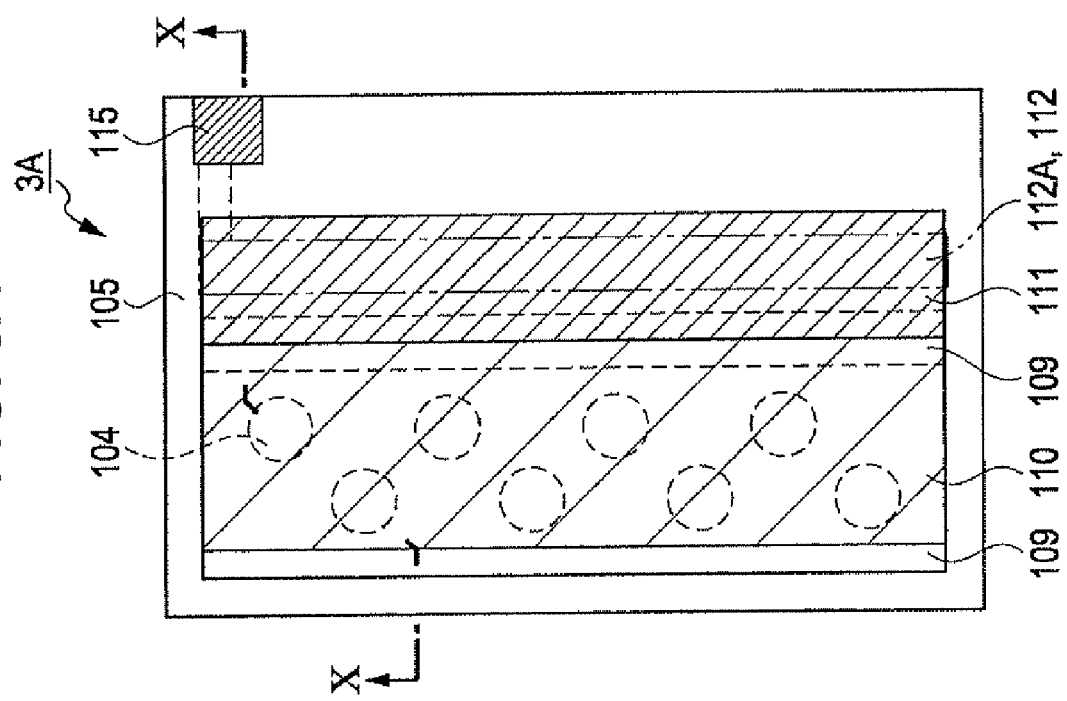

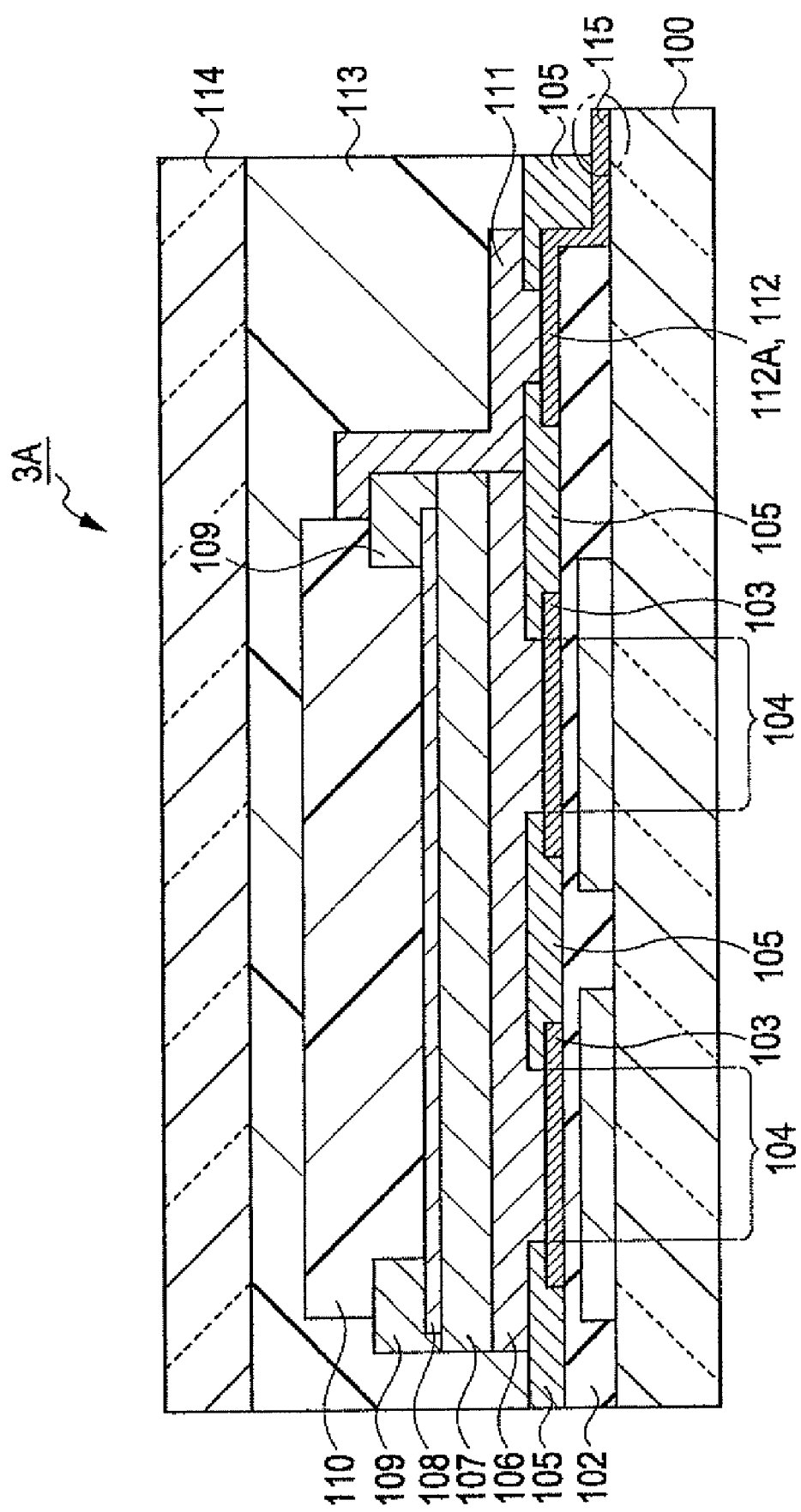

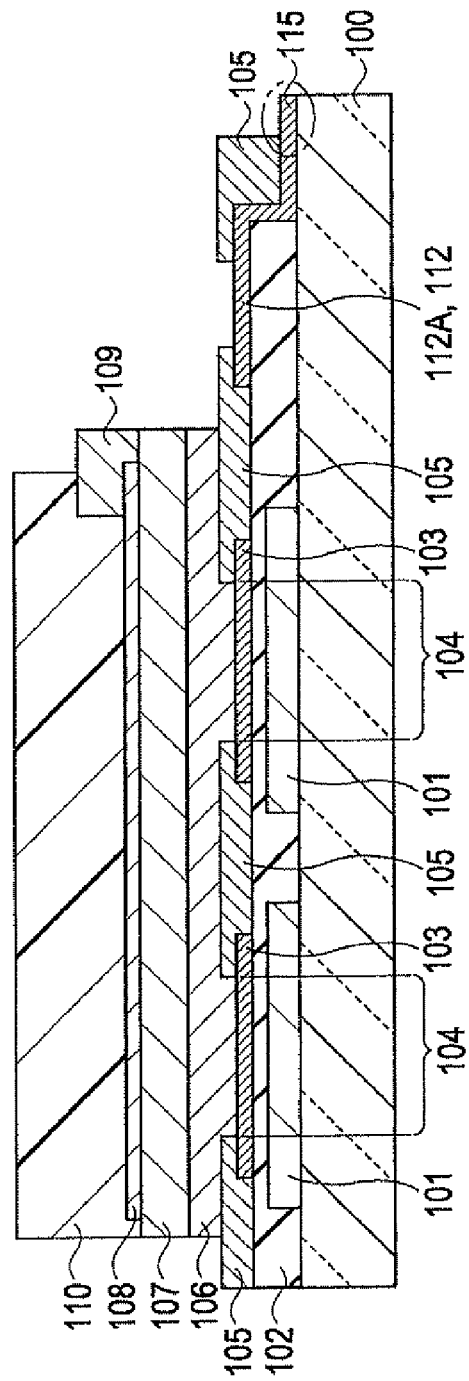
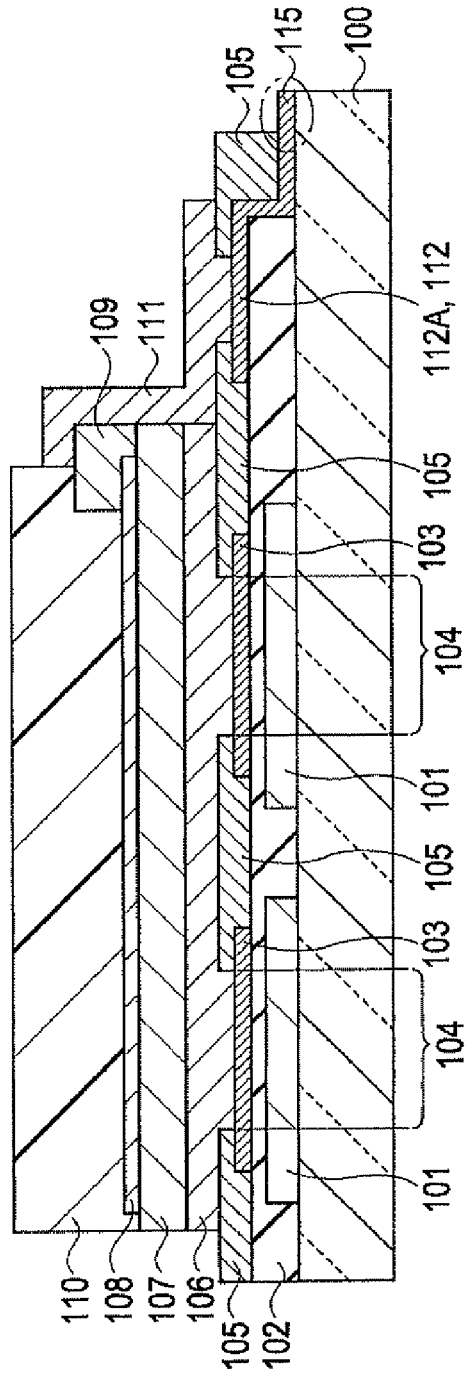

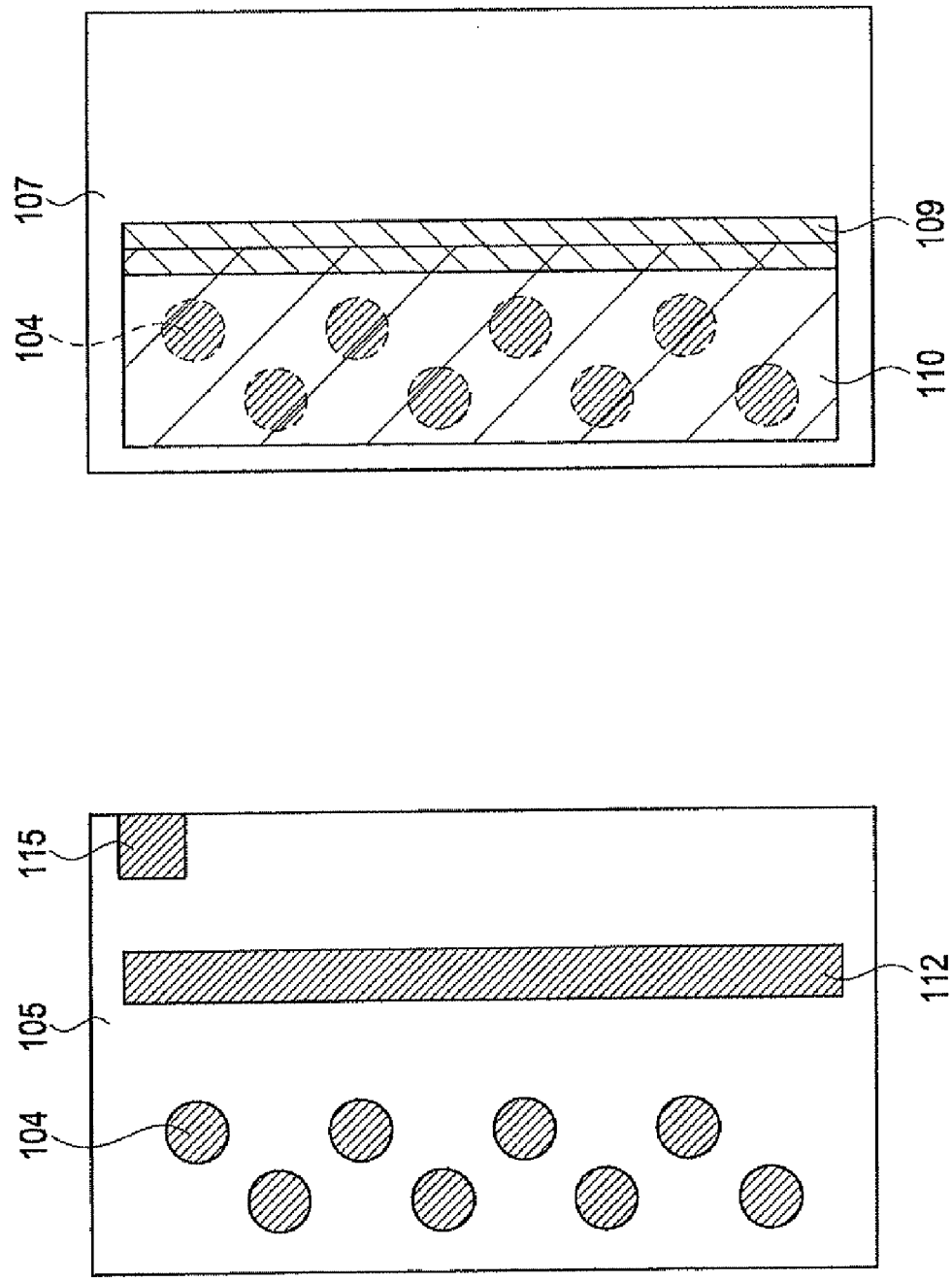

ORGANIC ELECTROLUMINESCENT DEVICE, METHOD FOR PRODUCING ORGANIC ELECTROLUMINESCENT DEVICE, AND ELECTRONIC APPARATUS

BACKGROUND

1. Technical Field

The present invention relates to an organic electroluminescent device, a method for producing an organic electroluminescent device, and an electronic apparatus.

2. Related Art

Organic electroluminescent elements have been applied to light sources of printers. When organic electroluminescent elements are used as light sources of printers, it is important that the organic electroluminescent elements should emit highly uniform monochromatic light. As a method for forming organic electroluminescent elements with high uniformity, a method has been known in which an organic-light-emitting-layer precursor is applied to the entire surface of a substrate by, for example, spin coating, followed by drying and annealing, and then an unnecessary portion is removed by etching. JP-A-2007-242436 discloses a method including etching an organic light-emitting layer with a second electrode (which cooperates with a first electrode located adjacent to a substrate to supply the organic light-emitting layer with current) and a protective member arranged on the second electrode, the second electrode and the protective member serving as a mask.

In the case of employing the foregoing method, the second electrode needs to withstand etching and thus needs to have a large thickness. The use of the electrode having a large thickness reduces light transmittance, so that it is difficult to use a top-emission structure. Thus, a bottom-emission structure should be used. In the case of using the bottom-emission structure, light radiates from the substrate having a thickness of about 0.5 mm, thus disadvantageously leading to difficulty in designing an optical system that controls light emanating from the organic light-emitting layer.

SUMMARY

An advantage of some aspects of the invention is that it provides the following aspects and embodiments.

According to a first aspect of the invention, A method for producing an organic electroluminescent device includes forming a first electrode configured to partially cover a substrate, forming an organic light-emitting layer configured to cover the first electrode, forming an optically transparent second electrode that lies on a side of the organic light-emitting layer opposite the side adjacent to the first electrode and is superposed on a current-carrying portion of the first electrode in plan, forming a third electrode in at least part of a region that is not superposed on the current-carrying portion in plan, the third electrode being electrically connected to part of the second electrode, forming an optically transparent protective layer configured to cover at least a region of the second electrode where the second electrode is not superposed on the third electrode in plan, and removing part of the organic light-emitting layer with the third electrode and the protective layer serving as a mask.

In this case, at least part of the second electrode is covered with the protective layer or the third electrode. Thus, a region of the second electrode covered with the protective layer or the third electrode can be protected from an etching atmosphere in etching the organic light-emitting layer. That is, the at least part of the second electrode can be protected from damage due to the etching; hence, the second electrode can have a uniform thickness in this region. Thus, a uniform current can flow through the organic light-emitting layer compared with the case where the protective layer is not formed, thereby suppressing nonuniformity in luminance.

Etching can be performed with the third electrode serving as a mask, exposing the upper portion of a region where the third electrode functions as the mask. This can facilitate arrangement of a lead connected to the third electrode and electrical operation of the organic light-emitting layer.

Preferably, the method according to the first aspect further includes before forming the organic light-emitting layer, forming a partition wall configured to cover a region of the first electrode that is not superposed on the current-carrying portion in plan.

In this case, the partition wall is formed on a portion of the organic light-emitting layer that does not emit light because current does not pass through the portion. Thus, a reduction in light transmittance can be prevented, thereby producing a high-luminance organic electroluminescent device.

In this case, in forming the second electrode, the second electrode is preferably formed so as to be also superposed on part of the partition wall in plan. Furthermore, in forming the third electrode, the third electrode is preferably formed so as to be superposed on the partition wall in plan. Moreover, in forming the protective layer, the protective layer is preferably formed so as to be also superposed on part of the third electrode in plan.

In this case, the third electrode is formed above the partition wall arranged on the portion of the organic light-emitting layer that does not emit light because current does not pass through the portion. Thus, a reduction in light transmittance due to the third electrode can be prevented, thereby producing a high-luminance organic electroluminescent device. Furthermore, the protective layer can be formed between the second electrode and the third electrode to assuredly establish electrical connection between the third electrode and the second electrode, thereby providing the method for producing an organic electroluminescent device in which the second electrode can be reliably operated.

It is preferred that the method according to the first aspect further include forming a light-reflective layer between the substrate and the current-carrying portion.

In this case, light traveling toward the substrate can be reflected from the light-reflective layer to emerge from a portion remote from the substrate, thereby providing the method for producing an organic electroluminescent device with high luminous efficiency.

It is preferred that the first electrode be composed of a light-reflective material.

In this case, light traveling toward the substrate can be reflected from the light-reflective layer to emerge from a portion remote from the substrate without forming a light-reflective layer, thereby providing the method for producing an organic electroluminescent device with high luminous efficiency, the method including a small number of steps.

It is preferred that forming the organic light-emitting layer include applying a liquid organic-light-emitting-layer precursor.

In this case, the organic light-emitting layer can be formed with an inexpensive apparatus compared with the case where the organic light-emitting layer is formed by evaporation, thereby suppressing the production cost.

It is preferred that applying the liquid organic-light-emitting-layer precursor be performed by a method selected from spin coating, dip coating, screen printing, spraying, slit-die coating, and cap coating.

In this case, the organic light-emitting layer having a uniform thickness can be formed above the substrate, thereby providing the method for producing an organic electroluminescent device with high uniformity in emission intensity in the same plane.

It is preferred that the protective layer be composed of an inorganic material.

In this case, the protective layer having high resistance to etching during the etching of the organic light-emitting layer can be provided. The protective layer can be prevented from damage due to etching; hence, the transparency of the protective layer can be maintained at a high level, thereby providing the method for producing an organic electroluminescent device with higher luminance.

It is preferred that the protective layer be composed of a material that screens out ultraviolet rays.

In this case, ultraviolet rays generated in dry etching can be blocked by the protective layer, thus preventing damage to the organic light-emitting layer due to ultraviolet rays and providing the method for producing an organic electroluminescent device with high reliability.

According to the first aspect of the invention, the method further includes before forming the partition wall, forming a first lead on the substrate, and after removing part of the organic light-emitting layer, forming a second lead configured to electrically connect the third electrode to the first electrode. In forming the partition wall, the partition wall is formed so as not to be superposed on at least part of the first lead in plan. In forming the organic light-emitting layer, the organic light-emitting layer is formed so as to cover the first lead. In forming the protective layer, the protective layer is formed so as not to be superposed on the first lead in plan.

In this case, the second lead can be formed while the third electrode and the first lead are being exposed, thereby easily establishing the electrical connection.

It is preferable that the second lead be composed of a metal the same as that constituting the third electrode.

In this case, since the third electrode and the lead are composed of the same metal, the third electrode and the lead can be simultaneously formed using the same material. Thus, the same production apparatus can be used, facilitating control of layer-formation conditions. Furthermore, a reduction in capital investment can be achieved, and a period of time required for the determination of the layer-formation conditions can be reduced.

According to a second aspect of the invention, an organic electroluminescent device includes a first electrode arranged on one side of a substrate, a second electrode arranged opposite to the first electrode, an organic light-emitting layer arranged between the first electrode and the second electrode, a third electrode arranged in a region that is not superposed on a current-carrying portion of the first electrode in plan, the third electrode being electrically connected to part of the second electrode, an optically transparent layer arranged so as to cover a region of the second electrode that is not superposed on at least the third electrode, a mount terminal arranged on the one side of the substrate, a first lead electrically connected to the mount terminal, and a second lead configured to electrically connect the first lead to the third electrode.

In this case, a potential is applied from the mount terminal to the third electrode through the first and second leads, and then the potential is applied from the third electrode to the second electrode. That is, a potential can be applied from one side of the substrate to both first and second electrodes, thereby simplifying forming interconnections. Furthermore, the third electrode is arranged apart from a region that emits light and thus can have a thickness larger than that of the second electrode. The second electrode located in the region that emits light is connected to the third electrode and thus can be operated while a drop in voltage due to electrical resistance is being suppressed, thereby providing an organic electroluminescent device with suppressed nonuniformity in luminance due to electrical resistance.

Preferably, a plurality of the first electrodes are arranged on the one side of the substrate, and the device further includes a partition wall arranged in a region that is not superposed on the current-carrying portion of each of the plurality of first electrodes in plan. The partition wall separates the plurality of first electrodes from one another.

In this case, the first electrodes are separated by the partition wall, so that the end of each of the first electrodes is covered with the partition wall. The defects and nonuniformity in thickness are more likely to occur at the end than a portion other than the end of each of the first electrodes in plan. Thus, covering the ends with the partition wall can prevent the occurrence of nonuniformity in luminance and a reduction in life property due to defects, thereby providing an organic electroluminescent device having uniform luminance and excellent life properties.

The second electrode preferably has optical transparency, and the first electrode preferably has light reflectivity.

In this case, the first electrode located adjacent to the substrate has light reflectivity. The second electrode has optical transparency Thus, light emanating from the organic light-emitting layer and then traveling toward the substrate is reflected from the first electrode to emerge from the side of the optical transparent second electrode. The intensity of light emerging from the side of the second electrode is equal to the sum of the intensity of light emitted from the organic light-emitting layer toward the second electrode and the intensity of light reflected from the first electrode and then traveling toward the second electrode. Thereby, it is possible to provide an organic electroluminescent device with high photoelectric conversion efficiency, in which light emerges from the side of the second electrode.

It is preferable that the second electrode be optically transparent and that the device further include a light-reflective layer between the substrate and the current-carrying portion.

In this case, the light-reflective layer is arranged between the substrate and the current-carrying portion. Thus, the light-reflection properties can be designed regardless of a work function and electrical characteristics required for the current-carrying portion. Therefore, the light-reflective layer can be composed of a material having excellent light-reflection properties, providing an organic electroluminescent device with high photoelectric conversion efficiency, light emerging from the side of the second electrode.

According to a third aspect of the invention, an electronic apparatus includes any one of the organic electroluminescent devices described above.

In this case, the electronic apparatus includes any one of the organic electroluminescent devices described above; hence, the electronic apparatus can have high luminance and low nonuniformity in luminance compared with the related art.

BRIEF DESCRIPTION OF THE DRAWINGS

The invention will be described with reference to the accompanying drawings, wherein like numbers reference like elements.

FIGS. 7A, 7B, and 7C are plan views of organic EL devices according to a second modification of a first embodiment when viewed from above.

FIGS. 8A and 8B are plan views of the organic EL devices according to the second modification of the first embodiment when viewed from above.

FIG. 10 is a cross-sectional view taken along line X-X in FIG. 8A.

FIGS. 12A and 12B are cross-sectional views taken along line XII-XII and XII-XII, respectively, in FIG. 7B and illustrate the procedure for producing the organic EL device.

FIGS. 13A and 13B are plan views corresponding to FIGS. 11A and 11B, respectively.

DESCRIPTION OF EXEMPLARY EMBODIMENTS

First Embodiment

Organic Electroluminescent Element and Electronic Apparatus Including Same

Embodiments of the invention will be described below with reference to the attached drawings.

Figure 1:
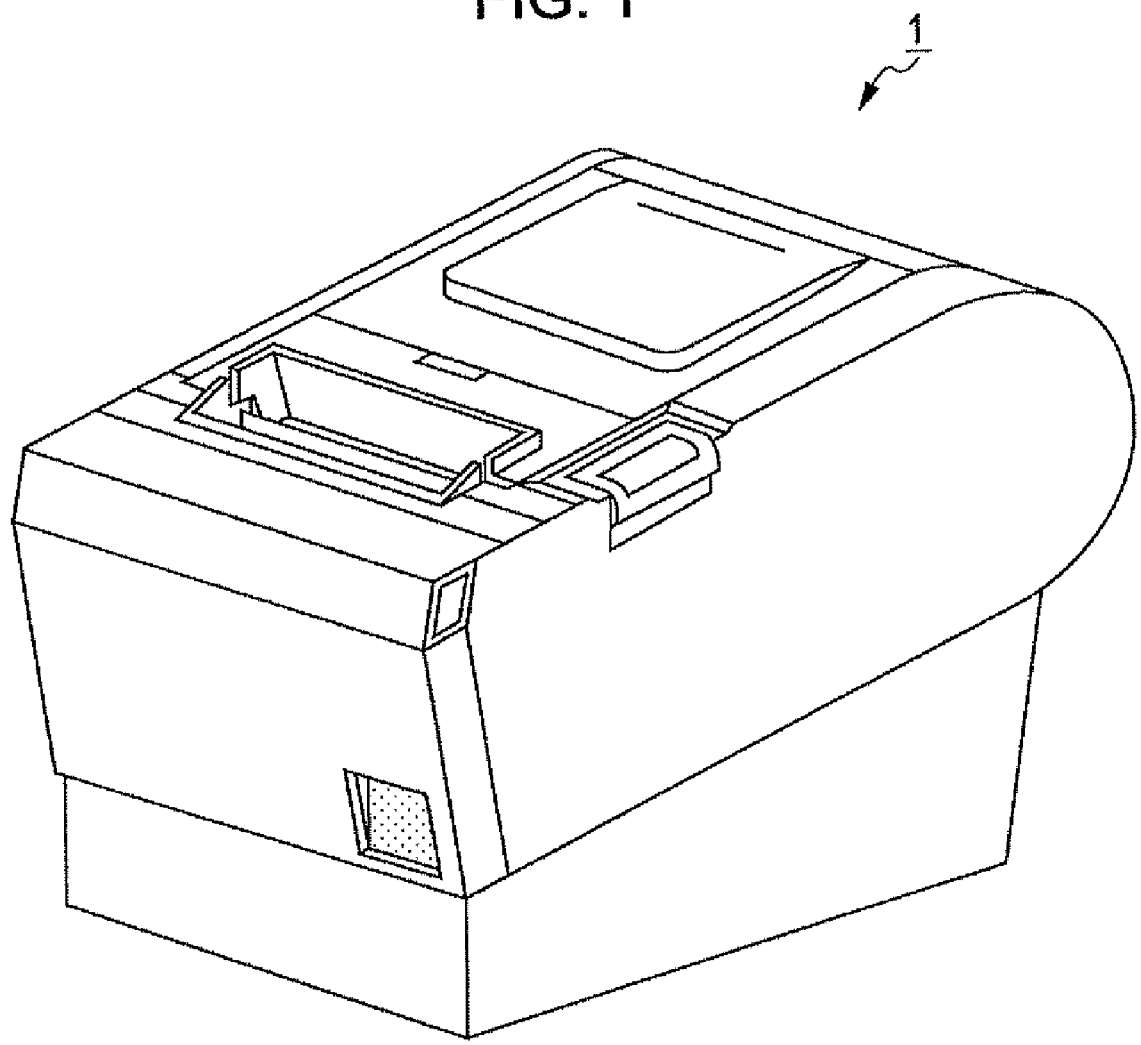
FIG. 1 is a perspective view of a page printer serving as an electronic apparatus.

FIG. 1 is a perspective view of a page printer serving as an electronic apparatus. A page printer 1 feeds in a print sheet in a feed tray, performs printing processing, and outputs the print sheet with image information.

Figure 2:
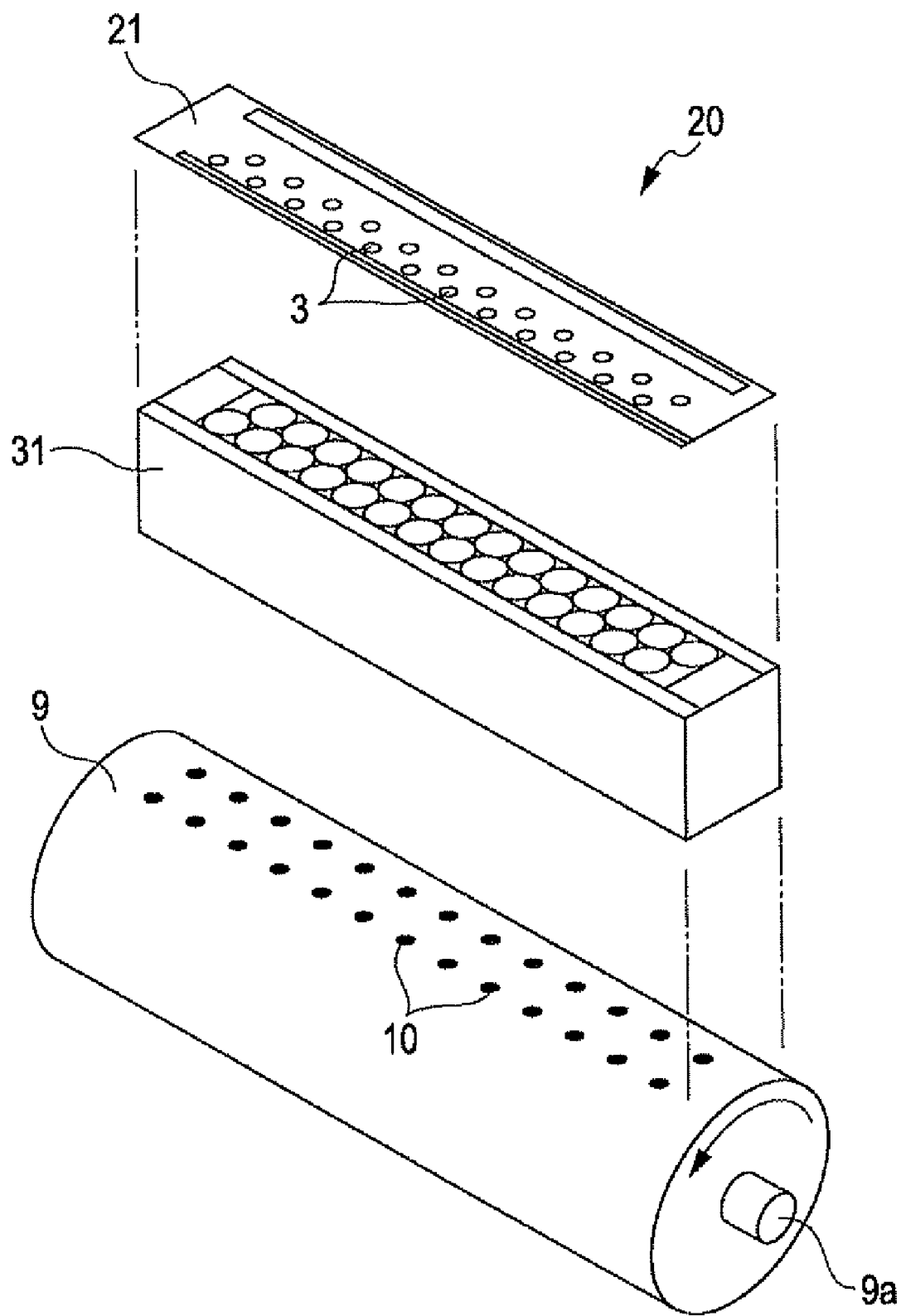
FIG. 2 is a schematic view of an exposure unit arranged in a page printer according to an embodiment.

FIG. 2 is a schematic view of an exposure unit 20 arranged in the page printer 1 according to an embodiment. The exposure unit 20 includes a line head 21 constituted by organic electroluminescent elements (hereinafter, referred to as "organic EL elements") 3, a lens array 31 configured to bring light passing through the line head 21 into focus to form an image, a photoconductive drum 9 exposed with light passing through the lens array 31 from the line head 21, and a rotating drum shaft 9a.

When the organic EL elements 3 emit light beams, the photoconductive drum 9 is irradiated with the light beams passing through the lens array 31. Toner 10 adheres to areas irradiated with the light beams. This step is performed while the rotating drum shaft 9a is being rotated, so that the toner 10 adheres to the photoconductive drum 9 to form an image on the photoconductive drum 9. The toner 10 on the photoconductive drum 9 is transferred to a print sheet to form an image on the print sheet. After printing, the print sheet is ejected to complete the image formation. Next, the organic EL elements 3 serving as elements irradiating the photoconductive drum 9 with light beams will be described.

Figure 3A:
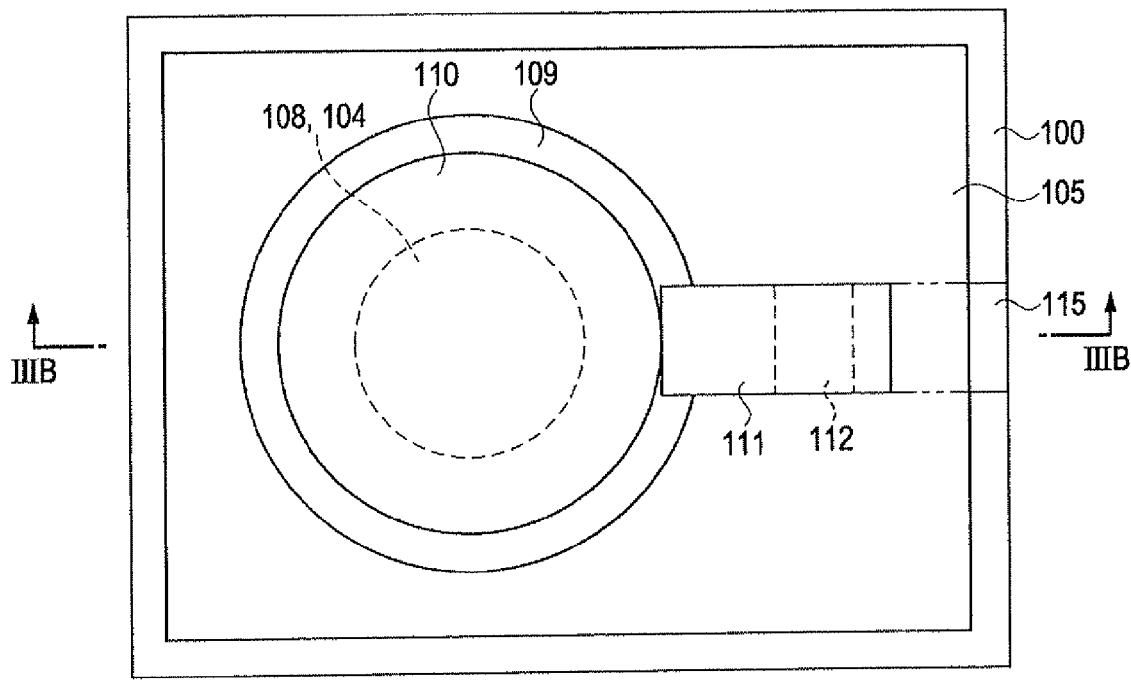
FIG. 3A is a plan view of an organic EL element.
Figure 3B:
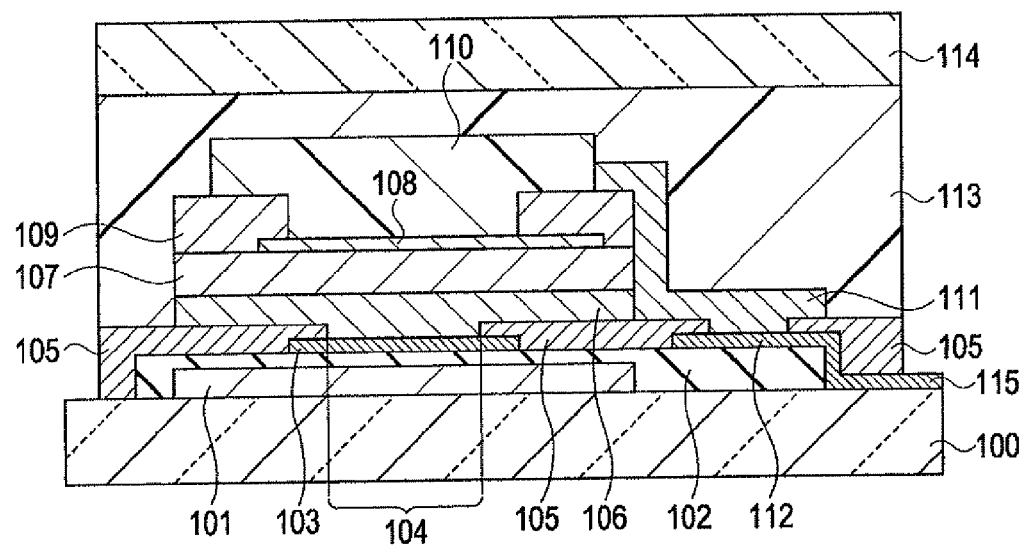
FIG. 3B is a cross-sectional view taken along line IIIB-IIIB in FIG. 3A.

FIG. 3A is a plan view of the organic EL elements 3 when viewed from above. FIG. 3B is a cross-sectional view taken along line IIIB-IIIB in FIG. 3A. FIG. 3A is a plan view excluding an optically transparent sealing layer 113 and an optically transparent counter substrate 114 described below.

Each of the organic EL elements 3 includes an optically transparent substrate 100 composed of, for example, glass, a reflective layer 101, an interlayer insulating layer 102, an positive electrode 103 serving as a first electrode, a current-carrying portion 104, a partition wall 105, a hole injection layer 106, an organic light-emitting layer 107, an optically transparent negative electrode 108 serving as a second electrode, a third electrode 109, a protective layer 110 composed of, for example, ZnO that is optically transparent in the visible region and screens out ultraviolet rays, a lead 111, a negative-electrode contact portion 112, the optically transparent sealing layer 113, the optically transparent counter substrate 114, and a mount terminal 115. For convenience, the term "upper direction" indicates a direction normal to the substrate 100 and a direction in which a plane of the organic light-emitting layer 107 recedes from the substrate.

The reflective layer 101 located on the substrate 100 reflects light, which is incident on the substrate 100, in the (upward) direction away from the substrate 100 to collect light on the upper side. That is, each of the organic EL elements 3 has a top-emission structure. The interlayer insulating layer 102 is configured to separate the reflective layer 101 from the positive electrode 103 to prevent electrolytic corrosion due to the contact between the layers.

The current-carrying portion 104 is a region in which the positive electrode 103 does not superpose the partition wall 105 in plan and which is in electrical contact with the hole injection layer 106. The current-carrying portion 104 supplies the organic light-emitting layer 107 with current to allow the organic light-emitting layer 107 to emit light. The partition wall 105 prevents the supply of current to a region in the organic light-emitting layer 107, the region being not allowed to emit light.

The hole injection layer 106 is supplied with current from the current-carrying portion 104 to supply holes to the organic light-emitting layer 107. The organic light-emitting layer 107 emits light by the recombination of injected holes and electrons supplied from the negative electrode 108. The negative electrode 108 cooperates with the current-carrying portion 104 of the positive electrode to allow current to flow through the organic light-emitting layer 107, thereby supplying the organic light-emitting layer 107 with electrons. Since the negative electrode 108 is optically transparent, light emanating from the organic light-emitting layer 107 can be efficiently emitted in the upward direction.

The third electrode 109 supplies the negative electrode 108 with current and also functions as a mask used in a step of etching the hole injection layer 106 and the organic light-emitting layer 107 described below. The third electrode 109 is typically formed so as to surround the negative electrode 108. The protective layer 110 is formed so as to prevent damage to the hole injection layer 106 and the organic light-emitting layer 107 during the etching step and also prevent penetration of water and the like during the production process. Since the protective layer 110 is optically transparent in the visible region, light emanating from the organic light-emitting layer 107 can be efficiently emitted in the upward direction. The protective layer 110 screens out ultraviolet rays and can thus protect the organic light-emitting layer 107 from ultraviolet rays produced in the step of etching the hole injection layer 106 and the organic light-emitting layer 107 by dry etching. The protective layer 110 is typically arranged so as to cooperate with the third electrode 109 to cover the entire negative electrode 108 and prevent damage to the negative electrode 108 during the etching step. Furthermore, the protective layer 110 is arranged so as to overlap the third electrode 109 and so as not to damage a portion between the third electrode 109 and the negative electrode 108. Moreover, the protective layer 110 is arranged so as not to be present at a portion where the third electrode 109 is in contact with the lead 111, thus establishing a satisfactory contact between the third electrode 109 and the lead 111.

The lead 111 is located between the negative-electrode contact portion 112 and the third electrode 109 and supplies current from the negative-electrode contact portion 112 to the third electrode 109. The lead 111 and the third electrode 109 are suitably composed of the same material because the same production apparatus can be used. However, they need not necessarily be composed of the same material and may be composed of different materials. The negative-electrode contact portion 112 has the function to conduct current from the mount terminal 115 to the lead 111. The sealing layer 113 hermetically seals these members formed on the substrate 100 and is bonded to the counter substrate 114. Since the sealing layer 113 is optically transparent, light emanating from the organic light-emitting layer 107 can be efficiently emitted in the upward direction. The counter substrate 114 covers the members formed on the substrate 100 with the sealing layer 113. The counter substrate 114 prevents deterioration of the organic light-emitting layer 107 due to water and an atmosphere such as oxygen. Since the counter substrate 114 is optically transparent, light emanating from the organic light-emitting layer 107 is efficiently emitted in the upward direction.

The mount terminal 115 has the function to conduct current from the outside of the corresponding organic EL element 3 to the negative-electrode contact portion 112.

The above-described structure makes it possible to prevent damage to the negative electrode 108 during the etching step of etching the hole injection layer 106 and the organic light-emitting layer 107 (usually, dry etching under ashing conditions) and damage to the organic light-emitting layer 107 due to ultraviolet rays produced in the etching.

The partition wall 105 need not necessarily be formed. In the case where the partition wall 105 is not formed, the current-carrying portion 104 is defined as a region of the positive electrode 103 where the positive electrode 103 superposes the negative electrode 108 in plan.

First Modification of First Embodiment

In the foregoing embodiment, the reflective layer 101, the interlayer insulating layer 102, and the positive electrode 103 are formed on the substrate 100, and light emanating from the organic light-emitting layer 107 is emitted upward. Alternatively, the reflective layer 101, the interlayer insulating layer 102, and the positive electrode 103 may be replaced with a light-reflective positive electrode, resulting in a simpler structure. In this case, the positive electrode 103 is composed of a material selected from silver, gold, nickel, palladium, platinum, silicon, alloys thereof, mixtures thereof, and doped materials thereof and has a thickness of about 200 nm. Light emitted from the organic light-emitting layer 107 toward the substrate 100 is reflected from the positive electrode 103 to travel upward, thereby increasing luminous efficiency.

The current-carrying portion 104 has a circular shape as shown in FIG. 3A but may have any shape. Examples of the shape include rectangles, ellipses, polygons, indefinite shapes, and hollow shapes thereof.

As shown in FIG. 3A, the partition wall 105 has a shape concentric with respect to the current-carrying portion 104 and surrounds the current-carrying portion 104. The partition wall 105 is not limited to the planar shape and need not surround the current-carrying portion 104 as long as the current-carrying portion 104 on the positive electrode 103 is not entirely covered with the partition wall 105. For example, the foregoing shape may be used. Furthermore, the partition wall 105 may be constituted by separated segments.

Each of the hole injection layer 106 and the organic light-emitting layer 107 may have any shape as long as at least a region of each of the hole injection layer 106 and the organic light-emitting layer 107 is superposed on the current-carrying portion 104 in plan. Examples of the planar shape thereof include rectangles, ellipses, polygons, indefinite shapes, and hollow shapes thereof.

The negative electrode 108 may have any shape as long as at least a region of the negative electrode 108 is superposed on the current-carrying portion 104 in plan. Examples of the planar shape thereof include rectangles, ellipses, polygons, indefinite shapes, and hollow shapes thereof.

The third electrode 109 may have any shape as long as the third electrode 109 overlaps the negative electrode 108 so as not to cover at least a region where the negative electrode 108 is superposed on the current-carrying portion 104 in plan. The foregoing shape may be used as the planar shape.

The protective layer 110 preferably has a shape such that the protective layer 110 cooperates with the third electrode 109 to cover the negative electrode 108 in plan. However, the protective layer 110 need not necessarily cover the entire negative electrode. The foregoing shape may be used as the planar shape. In this case, in a region where the negative electrode 108 is covered with the protective layer 110, the negative electrode 108 and the organic light-emitting layer 107 have improved reliability compared with the case where the protective layer 110 is not formed.

A suitable material constituting the protective layer 110 is, but not limited to, ZnO that is optically transparent in the visible region and screens out ultraviolet rays. Another suitable example of the material is TiO that has the same properties. Furthermore, the protective layer 110 need not necessarily be composed of an inorganic material that screens out ultraviolet rays and may also be composed of an organic material, e.g., an epoxy resin, an acrylic resin, a polyimide resin, or a polycarbonate resin, which is optically transparent in the visible region. In this case, the protective layer 110 can prevent damage to the negative electrode 108 during the etching step, and light can radiate from the upper side of the substrate 100. Alternatively, the protective layer 110 may be composed of, for example, silicon nitride, silicon oxide, or silicon oxynitride, which is optically transparent in the visible and ultraviolet regions. Also in this case, the protective layer 110 can prevent damage to the negative electrode 108 during the etching step, and light can radiate from the upper side of the substrate 100. The protective layer 110 composed of such an inorganic material exhibits a high selection ratio in subjecting the hole injection layer 106 and the organic light-emitting layer 107 to dry etching; hence, the protective layer 110 composed of the inorganic material can have a small thickness compared with the substrate 100 composed of an organic material, thereby resulting in a high light transmittance.

Second Modification of First Embodiment

In the foregoing embodiment, as shown in FIGS. 3A and 3B, one negative electrode 108 and one third electrode 109 are arranged with respect to one current-carrying portion 104 (light-emitting region). Alternatively, one negative electrode 108 and one third electrode 109 may be commonly arranged with respect to a plurality of the current-carrying portions 104. Specifically, a structure shown in FIGS. 7A, 7B, and 7C may be used.

Figure 9:
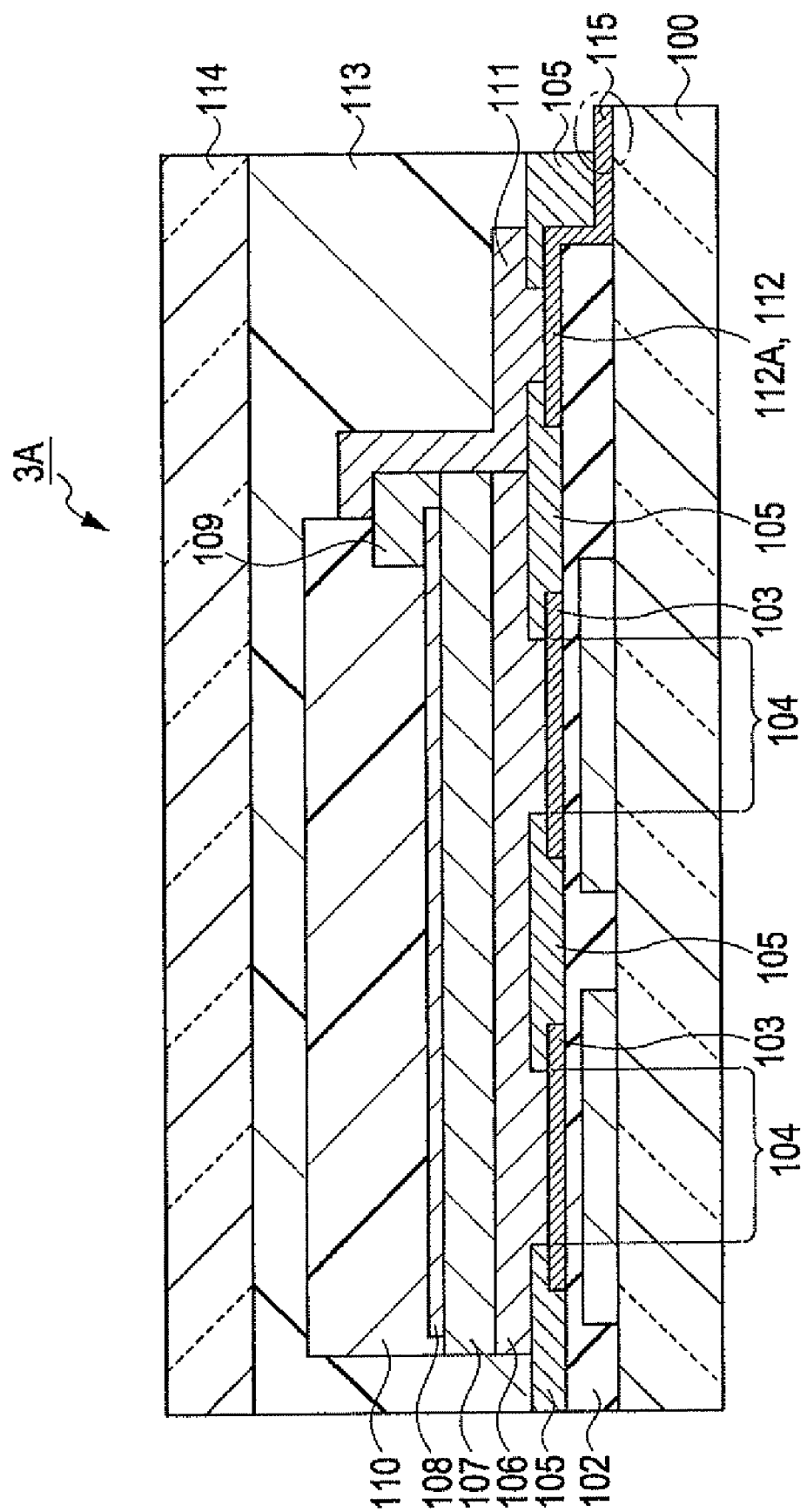
FIG. 9 is a cross-sectional view taken along line IX-IX in FIG. 7B.

FIGS. 7A, 7B, and 7C are plan views of organic EL devices 3A having a structure in which one negative electrode 108 and one third electrode 109 are arranged with respect to the plurality of current-carrying portions 104. For convenience in drawing, the layers arranged above each lead 111 are not shown. To facilitate understanding of the plan views, a cross-sectional view taken along line IX-IX shown in FIG. 7B is illustrated as FIG. 9. A structure shown in FIG. 9 is the same as in FIG. 3B, except that the plurality of current-carrying portions 104 are arranged, the negative electrode 108 is commonly used for the plurality of current-carrying portion 104, the third electrode 109 does not cover a side of the negative electrode 108 opposite the side adjacent to the mount terminal 115, and an end face of the negative electrode 108 that is not covered with the third electrode 109 is covered with the protective layer 110. Thus, details of the structure shown in FIG. 9 are omitted.

As shown in FIG. 7A, a wiring layer 112A provided with the mount terminal 115 located at an end thereof may have a pattern in which a plurality of the negative-electrode contact portions 112 are arranged along the direction in which the current-carrying portions 104 are arranged. In this case, since the negative-electrode contact portions 112 are separated in plan, the wiring layer 112A has a structure similar to a structure having connected small segments. Thus, stresses generated between the wiring layer 112A and other layers can be distributed, thereby suppressing the deterioration of the wiring layer 112A due to the stresses.

Alternatively, as shown in FIG. 7B, the wiring layer 112A provided with the mount terminal 115 located at an end thereof may extend substantially linearly along the direction in which the current-carrying portions 104 are arranged. In this case, the wiring layer 112A has a reduced perimeter and a large area; hence, the defects and nonuniformity in thickness, which are more likely to occur at ends than the middle portion of the wiring layer 112A, can be suppressed, so that the wiring layer 112A having high reliability can be provided.

Alternatively, as shown in FIG. 7C, the wiring layer 112A provided with the mount terminals 115 located at both ends thereof may extend substantially linearly along the direction in which the current-carrying portions 104 are arranged. In this case, a potential is applied from the mount terminals 115 located at both ends. Thus, a potential can be applied with only a drop in voltage compared with the case where a potential is applied from the mount terminal 115 located at the end, so that the wiring layer 112A that can suppresses nonuniformity in luminance can be provided.

As shown in FIG. 8A, the third electrodes 109 may be located at both sides of the negative electrode 108 so as to sandwich the negative electrode 108 and arranged along the direction in which the current-carrying portions 104 are arranged. In this case, the third electrode 109 located at a side of the negative electrode 108 opposite the side adjacent to the mount terminal 115 also functions as an auxiliary electrode, thereby reducing electrical resistance. Thus, it is possible to suppress variations in potential applied to the current-carrying portions 104 due to electrical resistance and suppress nonuniformity in luminance. FIG. 10 is a cross-sectional view taken along line X-X in FIG. 8A. A structure shown in FIG. 10 is the same as in FIG. 9, except that the third electrode 109 is also arranged on the side of the negative electrode 108 opposite the side adjacent to the mount terminal 115. Thus, details of the structure shown in FIG. 10 are omitted.

As shown in FIG. 8B, the third electrode 109 may be arranged so as to surround a plurality of the negative electrodes 108. The use of this structure results in a further reduced electrical resistance, thus suppressing variations in potential applied to the current-carrying portions 104 due to electrical resistance and suppressing nonuniformity in luminance. Furthermore, since end faces and sides (periphery) of the negative electrodes 108 are entirely covered with the third electrode 109, the end faces and the sides of the negative electrodes 108 need not be covered with the protective layer 110. Thus, the protective layer 110 can be formed with a mask used when the negative electrodes 108 are formed, thereby reducing the production cost.

In each of FIGS. 8A and 8B, while the wiring layer 112A has the same structure as in FIG. 7B, the wiring layer 112A may have the pattern in which the plurality of negative-electrode contact portions 112 are arranged shown in FIG. 7A. Alternatively, the wiring layer 112A may have the pattern in which the mount terminals 115 are located at both ends thereof shown in FIG. 7C. In these cases, it is possible to provide the same effects as described above.

As shown in FIGS. 7A to 7C and 8A and 8B, the staggered arrangement of the current-carrying portions 104 results in a higher density of the current-carrying portions (light-emitting regions) per unit area, thereby providing light-emitting elements with higher luminance. The current-carrying portions 104 need not necessarily be arranged in a staggered configuration but may be arranged in a matrix.

Second Embodiment

Method for Producing Organic EL Element

Figure 4A:
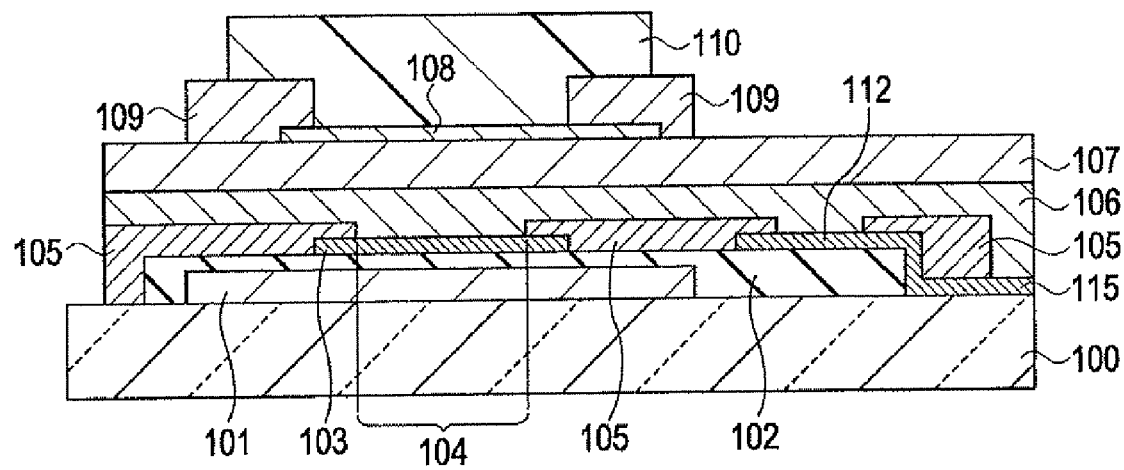
FIGS. 4A and 4B are cross-sectional views illustrating a procedure for producing an organic EL element.
Figure 4B:
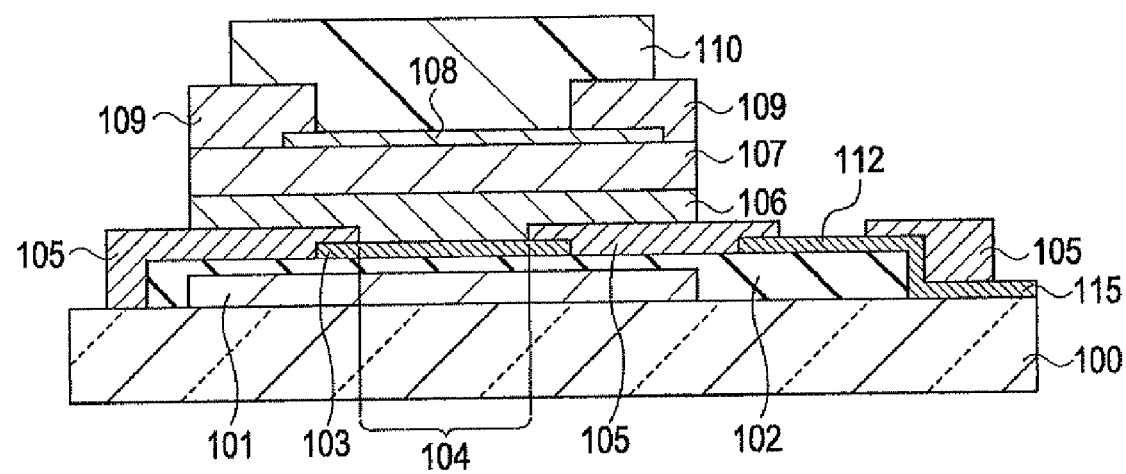
Figure 5:
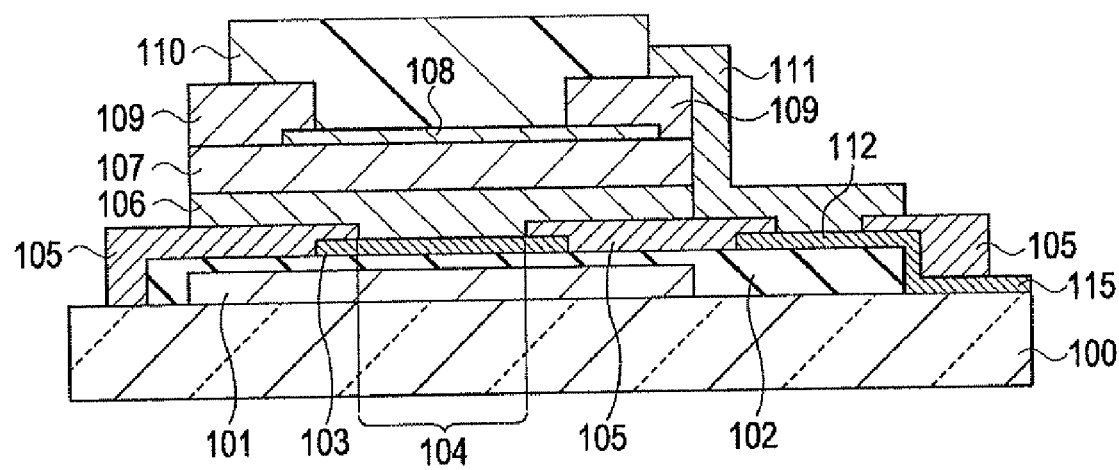
FIG. 5 is a cross-sectional view illustrating the procedure for producing the organic EL element.

A method for producing an organic EL element will be described below with reference to the attached drawings. FIGS. 4A, 4B, and 5 are cross-sectional views illustrating a procedure for producing the organic EL element 3.

As a step 1, after the optically transparent substrate 100 composed of, for example, glass is rinsed, an aluminum layer having a thickness of, for example, about 200 nm is deposited thereon by, for example, evaporation. An unnecessary portion is removed by photolithography and etching to form the reflective layer 101. Alternatively, in this step, the reflective layer 101 may be formed by evaporation with a shadow mask.

As a step 2, silicon nitride is deposited thereon by, for example, chemical vapor deposition (CVD). An unnecessary portion is removed by photolithography and etching to form the interlayer insulating layer 102. The arrangement of the interlayer insulating layer 102 prevents electrolytic corrosion due to the contact of indium-tin oxide (ITO) constituting the positive electrode 103 described below and aluminum. The interlayer insulating layer 102 may have a thickness of about 400 nm.

As a step 3, an ITO layer having a thickness of about 50 nm is formed by, for example, sputtering. An unnecessary portion is removed by photolithography and etching. In this step, the positive electrode 103 is formed as a first electrode having an island shape. The positive electrode 103 may have a thickness of about 50 nm.

As a step 4, the current-carrying portion 104, which defines the light-emitting region of the organic light-emitting layer 107 described below, and the partition wall 105 are formed. Specifically, silicon oxide is deposited by CVD, and then a portion of the resulting silicon oxide film located on the current-carrying portion 104 is removed by photolithography and etching. Typically, the middle portion of the positive electrode 103 is exposed. The partition wall 105 typically has a thickness of about 50 nm. The current-carrying portion 104 is in the form of a circle preferably having a diameter of about 40 μm.

As a step 5, a PEDT/PSS dispersion as a hole-injection-layer precursor is applied by spin coating, dried, and fired to form the hole injection layer 106. The hole injection layer 106 typically has a thickness of about 50 nm.

Figure 6:
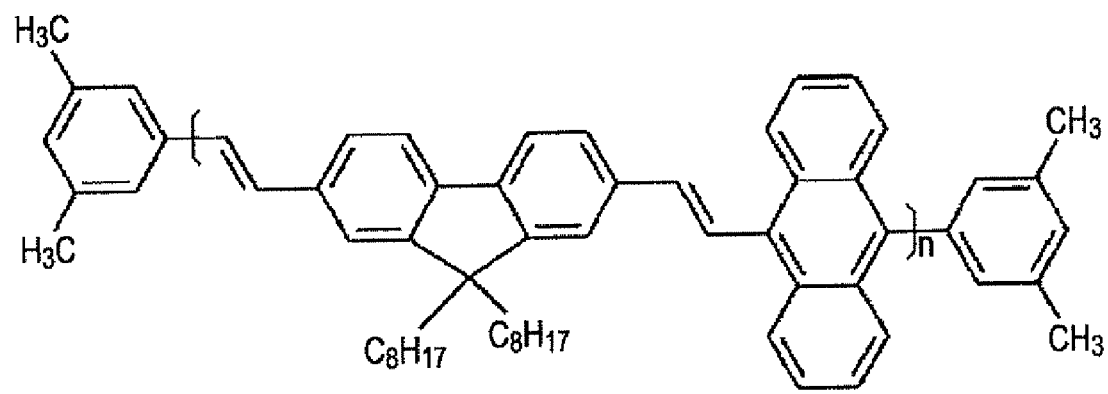
FIG. 6 shows a formula representing a red-light-emitting polymer.

As a step 6, a solution as an organic-light-emitting-layer precursor containing a red-light-emitting polymer of the formula shown in FIG. 6 is applied by spin coating, dried, and fired to form the organic light-emitting layer 107. The organic light-emitting layer 107 typically has a thickness of about 120 nm.

As a step 7, a MgAg layer is formed by co-evaporation (a method in which deposition is performed on the same region from separate evaporation sources). In this step, the layer may be formed with a shadow mask. Alternatively, patterning may be performed by photolithography and etching. Thereby, the negative electrode 108 is formed in this step. The negative electrode 108 has a circular shape in plan. The circular negative electrode 108 is arranged on the current-carrying portion 104 and extends slightly around the periphery of the current-carrying portion 104 in plan. The extension will be connected to a third electrode described below. The third electrode 109 has a low light transmittance; hence, the arrangement of the third electrode 109 within the partition wall 105 in plan permits light emanating from the organic light-emitting layer 107 to efficiently pass through the layers.

As a step 8, aluminum is deposited by evaporation with a shadow mask to form the third electrode 109. In this step, aluminum may be deposited by, for example, sputtering and then patterned by photolithography and etching.

As a step 9, the protective layer 110 is formed. The protective layer 110 is composed of, for example, ZnO that is optically transparent in the visible region and screens out ultraviolet rays. The protective layer 110 may be formed by ion plating or sputtering with a shadow mask.

FIG. 4A is a cross-sectional view of a structure formed by the steps 1 to 9.

As a step 10, the hole injection layer 106 and the organic light-emitting layer 107 are subjected to etching with the protective layer 110 and the third electrode 109 serving as a mask. The etching is performed by dry etching with plasma. The etching is performed under ashing conditions with at least one of oxygen and rare gases. In ashing, principally, the organic layers are selectively etched. Thus, portions of the negative electrode 108, the organic light-emitting layer 107, and the like covered with the protective layer 110 and the third electrode 109 in plan are protected. The protective layer 110 is composed of, for example, ZnO that screens out ultraviolet rays and thus absorbs ultraviolet rays generated in the plasma to prevent damage to the organic light-emitting layer 107 due to ultraviolet rays. In this step, the negative-electrode contact portion 112 and the mount terminal 115 are exposed. FIG. 4B is a cross-sectional view of a structure formed by the steps 1 to 10.

As a step 11, the lead 111 is formed to electrically connect the third electrode 109 to the negative-electrode contact portion 112. The lead 111 is formed by evaporation with a shadow mask using a material the same as that constituting the third electrode 109. Thus, the same evaporation source can be used for the lead 111 and the third electrode 109 composed of the same material, so that a simple evaporator can be used. This preferably facilitates maintenance management of the evaporator. Alternatively, another material may be used for the lead 111. FIG. 5 is a cross-sectional view of a structure formed by the steps 1 to 11.

As a step 12, the optically transparent counter substrate 114 composed of, for example, glass is fixed with the sealing layer 113 composed of, for example, an epoxy resin. The sealing layer 113 typically has a thickness of about 2 μm. The counter substrate 114 typically has a thickness of about 0.5 mm. After the completion of this step, the organic EL element 3 shown in FIGS. 3A and 3B is formed. It is possible to provide the organic EL element 3 by the production method including these steps.

First Modification of Second Embodiment

In the foregoing embodiment, the reflective layer 101, the interlayer insulating layer 102, and the positive electrode 103 are formed on the substrate 100 by the steps 1 to 3. Alternatively, the reflective layer 101, the interlayer insulating layer 102, and the positive electrode 103 may be replaced with a light-reflective positive electrode 103, simplifying the production process. In this case, the positive electrode 103 is composed of a material selected from silver, gold, nickel, palladium, platinum, silicon, alloys thereof, mixtures thereof, and doped materials thereof and has a thickness of about 200 nm. The light-reflective positive electrode can be formed by, for example, evaporation with a shadow mask.

The shape of the current-carrying portion 104 formed in the step 4 is not limited to a circle having a diameter of about 40 μm. Examples of the shape of the current-carrying portion 104 that may be used include rectangles, ellipses, polygons, indefinite shapes, and hollow shapes thereof. The partition wall 105 is not limited to the planar shape and need not surround the current-carrying portion 104 as long as the current-carrying portion 104 on the positive electrode 103 is not entirely covered with the partition wall 105. For example, the foregoing shape may be used.

Each of the hole injection layer 106 and the organic light-emitting layer 107 formed in the steps of 5 and 6 may have any shape as long as at least a region of each of the hole injection layer 106 and the organic light-emitting layer 107 is superposed on the current-carrying portion 104 in plan. For example, the foregoing shape may be used as the planar shape. In the steps 6 and 7, the PEDT/PSS dispersion and the solution containing the red-light-emitting polymer are applied by spin coating. Alternatively, they may be applied by, for example, dip coating, screen printing, spraying, slit-die coating, or cap coating. In any case, it is possible to provide a layer having highly uniform thickness.

The negative electrode 108 formed in the step 7 may have any shape as long as at least a region of the negative electrode 108 is superposed on the current-carrying portion 104 in plan. For example, the foregoing shape may be used as the planar shape.

The third electrode 109 formed in the step 8 may have any shape as long as the third electrode 109 overlaps the negative electrode 108 so as not to cover at least a region where the negative electrode 108 is superposed on the current-carrying portion 104 in plan. The foregoing shape may be used as the planar shape.

The protective layer 110 formed in the step 9 preferably has a shape such that the protective layer 110 cooperates with the third electrode 109 to cover the negative electrode 108 in plan. However, the protective layer 110 need not necessarily cover the entire negative electrode. The foregoing shape may be used as the planar shape. Furthermore, the protective layer 110 may be constituted by separated segments. In this case, in a region where the negative electrode 108 is covered with the protective layer 110, the negative electrode 108 and the organic light-emitting layer 107 have improved reliability compared with the case where the protective layer 110 is not formed.

A suitable material constituting the protective layer 110 is, but not limited to, ZnO that is optically transparent in the visible region and screens out ultraviolet rays. Another suitable example of the material is TiO that has the same properties. Furthermore, the protective layer 110 need not necessarily be composed of an inorganic material that screens out ultraviolet rays and may also be composed of an organic material, e.g., an epoxy resin, an acrylic resin, a polyimide resin, or a polycarbonate resin, which is optically transparent in the visible region. In this case, the protective layer 110 can prevent damage to the negative electrode 108 during the etching step, and light can radiate from the upper side of the substrate 100. Alternatively, the protective layer 110 may be composed of, for example, silicon nitride, silicon oxide, or silicon oxynitride, which is optically transparent in the visible and ultraviolet regions. Also in this case, the protective layer 110 can prevent damage to the negative electrode 108 during the etching step, and light can radiate from the upper side of the substrate 100. The protective layer 110 composed of such an inorganic material exhibits a high selection ratio in subjecting the hole injection layer 106 and the organic light-emitting layer 107 to dry etching; hence, the protective layer 110 composed of the inorganic material can have a small thickness compared with the substrate 100 composed of an organic material, thereby resulting in a high light transmittance.

Second Modification of Second Embodiment

Figure 11A:
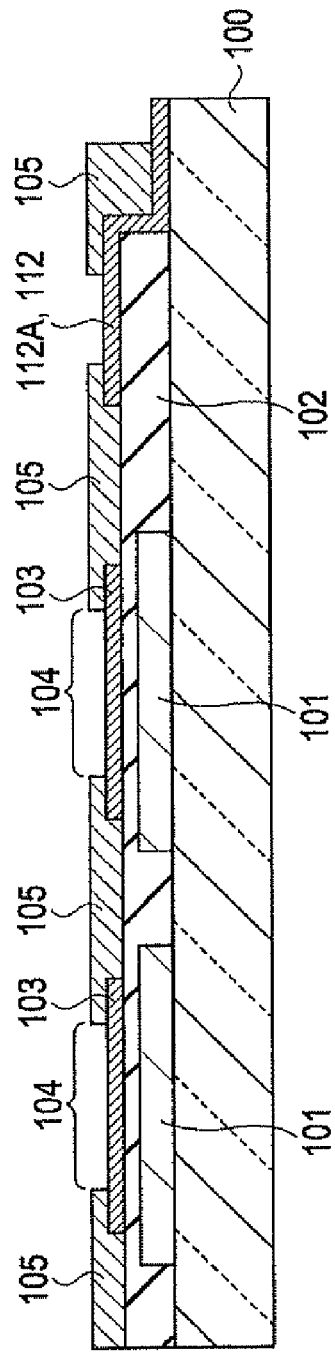
FIGS. 11A and 11B are cross-sectional views taken along line XI-XI and XI-XI, respectively, in FIG. 7B and illustrate a procedure for producing the organic EL device.
Figure 11B:
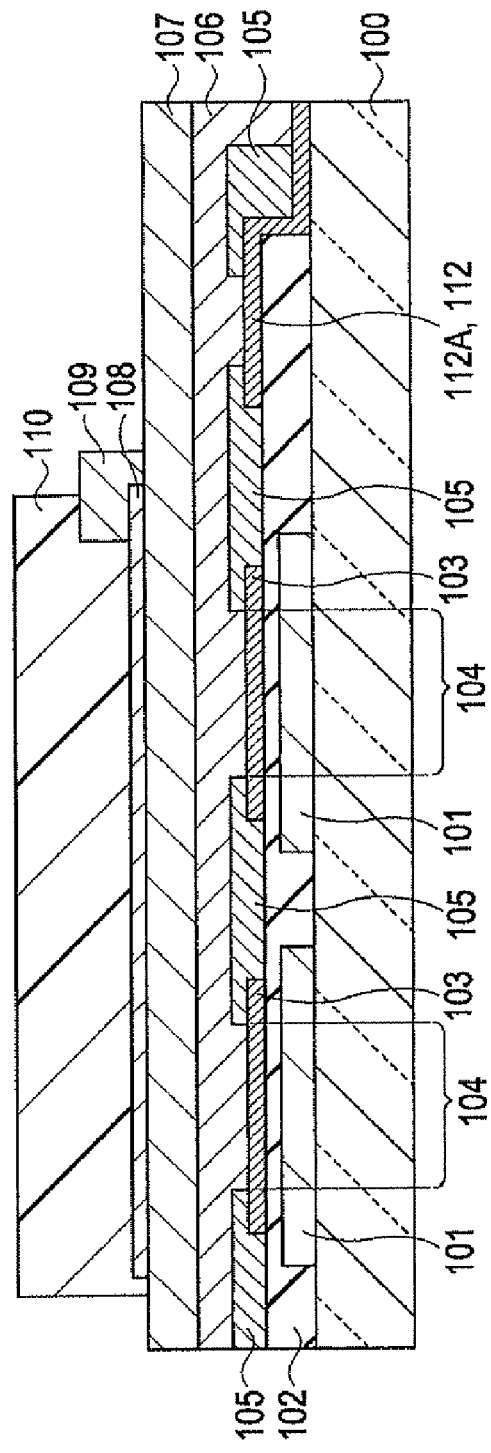

In the foregoing embodiment, as shown in FIGS. 4A, 4B, and 5, the method for producing the structure in which one negative electrode 108 and one third electrode 109 are arranged with respect to one current-carrying portion 104 (light-emitting region) has been described. The method can be applied to a structure in which one negative electrode 108 and one third electrode 109 are commonly arranged with respect to a plurality of the current-carrying portions 104. A method for producing the structure in which one negative electrode 108 and one third electrode 109 are commonly arranged with respect to the plurality of current-carrying portions 104 will be described below. A method for producing the organic EL device having a planar structure shown in FIG. 7B will be described because of a small difference in plane pattern. FIGS. 11A and 11B are cross-sectional views taken along line XI-XI in FIG. 7B in the course of the production process. FIGS. 12A and 12B are cross-sectional views taken along line XII-XII in FIG. 7B in the course of the production process. FIGS. 13A, 13B, 14A, and 14B are plan views corresponding to FIGS. 11A, 11B, 12A, and 12B, respectively. The production process will be described below with reference to FIGS. 11A, 11B 12A, 12B, 13A, 13B, 14A, and 14B.

As a step 1, after the optically transparent substrate 100 composed of, for example, glass is rinsed, an aluminum layer having a thickness of, for example, about 200 nm is deposited thereon by, for example, evaporation. An unnecessary portion is removed by photolithography and etching to form the reflective layers 101. Alternatively, in this step, the reflective layers 101 may be formed by evaporation with a shadow mask.

As a step 2, silicon nitride is deposited thereon by, for example, CVD. An unnecessary portion is removed by photolithography and etching to form the interlayer insulating layer 102. The arrangement of the interlayer insulating layer 102 prevents electrolytic corrosion due to the contact of ITO constituting the positive electrodes 103 described below and aluminum. The interlayer insulating layer 102 may have a thickness of about 400 nm.

As a step 3, an ITO layer having a thickness of about 50 nm is formed by, for example, sputtering. An unnecessary portion is removed by photolithography and etching. In this step, a plurality of the positive electrodes 103 are formed as first electrodes each having an island shape. The resulting. ITO layers serve also as the wiring layer 112A and the mount terminal 115 described below and are formed simultaneously with the plurality of positive electrodes 103. Each of the positive electrodes 103 may have a thickness of about 50 nm. Alternatively, in this step, sputtering may be performed with a shadow mask.

As a step 4, the current-carrying portions 104, which define the light-emitting regions of the organic light-emitting layer 107 described below, and the partition wallpartition wall 105 are formed. Specifically, silicon oxide is deposited by CVD, and then portions of the resulting silicon oxide film located on the current-carrying portions 104 are removed by photolithography and etching. Typically, the middle portion of each of the positive electrodes 103 is exposed. The partition wallpartition wall 105 typically has a thickness of about 50 nm. Each of the current-carrying portions 104 is in the form of a circle preferably having a diameter of about 40 µm. A cross-sectional view and a plan view of a structure formed by these steps are shown in FIGS. 11A and 13A, respectively.

As a step 5, a PEDT/PSS dispersion as a hole-injection-layer precursor is applied by spin coating, dried, and fired to form the hole injection layer 106. The hole injection layer 106 typically has a thickness of about 50 nm.

As a step 6, a solution as an organic-light-emitting-layer precursor containing a red-light-emitting polymer of the formula shown in FIG. 6 is applied by spin coating, dried, and fired to form the organic light-emitting layer 107. The organic light-emitting layer 107 typically has a thickness of about 120 nm.

As a step 7, a MgAg layer is formed by co-evaporation (a method in which deposition is performed on the same region from separate evaporation sources). In this step, the layer may be formed with a shadow mask. Alternatively, patterning may be performed by photolithography and etching. Thereby, the negative electrode 108 is formed in this step. The negative electrode 108 has a rectangular shape in plan so as to cover the plurality of current-carrying portions 104. The negative electrode 108 is partially connected to the third electrode described below.

As a step 8, aluminum is deposited by evaporation with a shadow mask to form the third electrode 109. In this step, aluminum may be deposited by, for example, sputtering and then patterned by photolithography and etching. The third electrode 109 has a low light transmittance; hence, the third electrode 109 is arranged so as to be superposed on the partition wall 105 and thus does not preclude the passage of light emanating from the organic light-emitting layer 107.

As a step 9, the protective layer 110 is formed. The protective layer 110 is composed of, for example, ZnO that is optically transparent in the visible region and screens out ultraviolet rays. The protective layer 110 may be formed by ion plating or sputtering with a shadow mask. The protective layer 110 is preferably formed so as to cover an end face of the negative electrode 108, thereby preventing damage to the negative electrode 108 in the production process. The periphery of the negative electrode 108 is superposed on peripheries of the current-carrying portions 104 in plan. Thus, even if the periphery of the negative electrode 108 is slightly damaged, the damaged periphery has a less effect on the light-emitting properties. In the case where the periphery of the negative electrode 108 is not covered with the protective layer 110, only a slight reduction in reliability is observed. That is, practical life properties can be provided. A cross-sectional view and a plan view of a structure formed by the steps 1 to 9 are shown in FIGS. 11B and 13B, respectively.

Figure 14A:
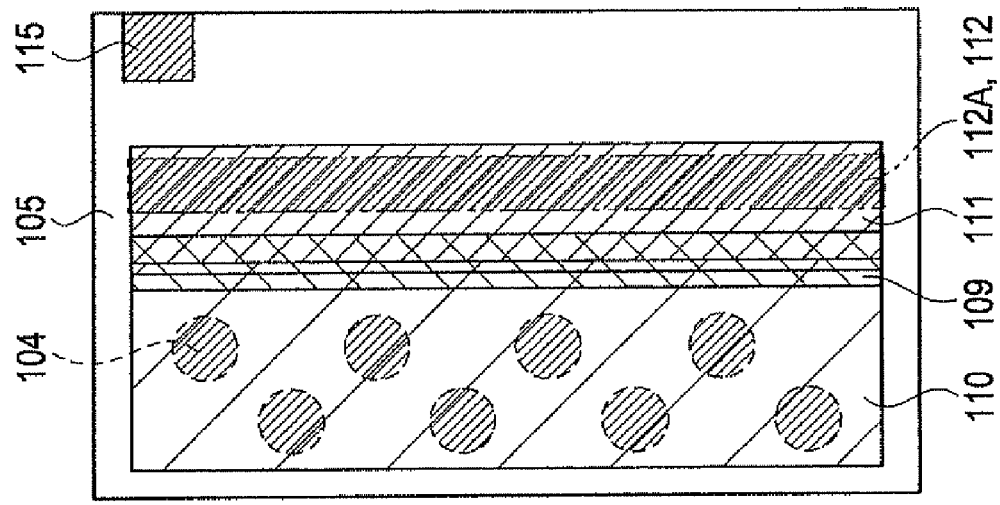
FIGS. 14A and 14B are plan views corresponding to FIGS. 12A and 12B, respectively.

As a step 10, unnecessary portions of the hole injection layer 106 and the organic light-emitting layer 107 are subjected to etching with the protective layer 110 and the third electrode 109 serving as a mask. The etching is performed by dry etching with plasma. The etching is performed under ashing conditions with at least one of oxygen and rare gases. Alternatively, an etching gas that can provide a high selection ratio of the protective layer 110 and the third electrode 109 to the hole injection layer 106 and the organic light-emitting layer 107 may be used. In ashing, principally, the organic layers are selectively etched. Thus, portions of the negative electrode 108, the organic light-emitting layer 107, and the like covered with the protective layer 110 and the third electrode 109 in plan are protected. The protective layer 110 is composed of, for example, ZnO that screens out ultraviolet rays and thus absorbs ultraviolet rays generated in the plasma to prevent damage to the organic light-emitting layer 107 due to ultraviolet rays. In this step, the negative-electrode contact portion 112 and the mount terminal 115 are exposed. A cross-sectional view and a plan view of a structure formed by the steps 1 to 10 are shown in FIGS. 12A and 14A, respectively.

Figure 14B:
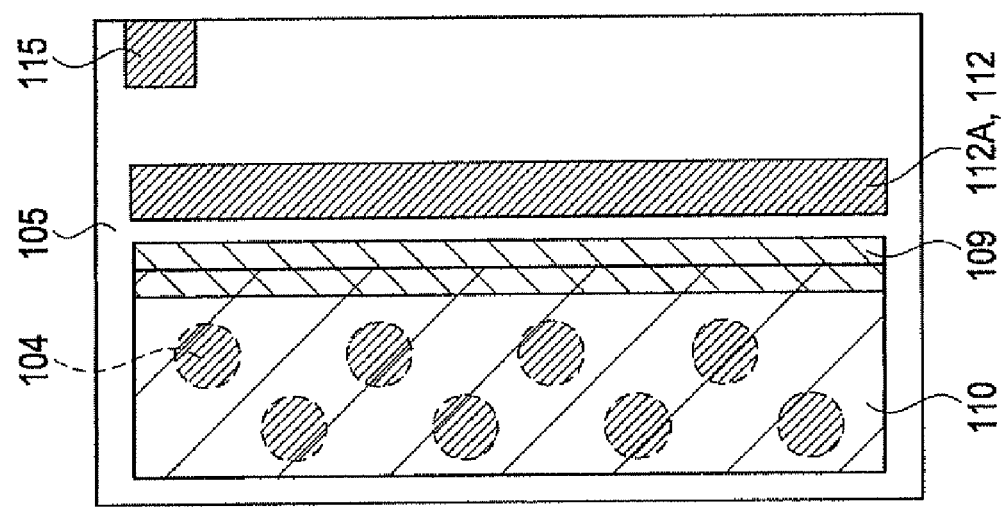

As a step 11, the lead 111 is formed to electrically connect the third electrode 109 to the negative-electrode contact portion 112. The lead 111 is formed by evaporation with a shadow mask using a material the same as that constituting the third electrode 109. Thus, the same evaporation source can be used for the lead 111 and the third electrode 109 composed of the same material, so that a simple evaporator can be used. This preferably facilitates maintenance management of the evaporator. Alternatively, the lead 111 may be composed of a material different from that constituting the third electrode 109. A cross-sectional view and a plan view of a structure formed by the steps 1 to 11 are shown in FIGS. 12B and 14B, respectively.

As a step 12, the optically transparent counter substrate 114 composed of, for example, glass is fixed with the sealing layer 113 composed of, for example, an epoxy resin. The sealing layer 113 typically has a thickness of about 2 μm. The counter substrate 114 typically has a thickness of about 0.5 mm. After the completion of this step, the organic EL device 3A shown in FIG. 7B is formed. It is possible to provide the organic FL device 3A including the organic EL elements 3 shown in FIG. 2 by the production method including these steps.

The entire disclosure of Japanese Patent Application Nos: 2007-325591, filed Dec. 18, 2007 and 2008-238966, filed Sep. 18, 2008 are expressly incorporated by reference herein.

What is claimed is:

1. A method for producing an organic electroluminescent device, comprising:
    forming a first electrode configured to partially cover a substrate;
    forming an organic light-emitting layer configured to cover the first electrode;
    forming an optically transparent second electrode that lies on a side of the organic light-emitting layer opposite the side adjacent to the first electrode and is superposed on a current-carrying portion of the first electrode in plan;
    forming a third electrode in at least part of a region that is not superposed on the current-carrying portion in plan, the third electrode being electrically connected to part of the second electrode;
    forming an optically transparent protective layer configured to cover at least a region of the second electrode where the second electrode is not superposed on the third electrode in plan; and
    removing part of the organic light-emitting layer with the third electrode and the protective layer serving as a mask.

2. The method according to claim 1, further comprising:
    before forming the organic light-emitting layer, forming a partition wall configured to cover a region of the first electrode that is not superposed on the current-carrying portion in plan.

3. The method according to claim 2,
    wherein in forming the second electrode, the second electrode is formed so as to be also superposed on part of the partition wall in plan,
    in forming the third electrode, the third electrode is formed so as to be superposed on the partition wall in plan, and
    in forming the protective layer, the protective layer is formed so as to be also superposed on part of the third electrode in plan.

4. The method according to claim 2, further comprising:
    before forming the partition wall, forming a first lead on the substrate; and
    after removing part of the organic light-emitting layer, forming a second lead configured to electrically connect the third electrode to the first electrode,
    wherein in forming the partition wall, the partition wall is formed so as not to be superposed on at least part of the first lead in plan,
    in forming the organic light-emitting layer, the organic light-emitting layer is formed so as to cover the first lead, and
    in forming the protective layer, the protective layer is formed so as not to be superposed on the first lead in plan.

5. The method according to claim 4, wherein the second lead is composed of a metal the same as that constituting the third electrode.

6. The method according to claim 1, further comprising:
    forming a light-reflective layer between the substrate and the current-carrying portion.

7. The method according to claim 1, wherein the first electrode is composed of a light-reflective material.

8. The method according to claim 1, wherein forming the organic light-emitting layer includes applying a liquid organic-light-emitting-layer precursor.

9. The method according to claim 8, wherein applying the liquid organic-light-emitting-layer precursor is performed by a method selected from spin coating, dip coating, screen printing, spraying, slit-die coating, and cap coating.

10. The method according to claim 1, wherein the protective layer is composed of an inorganic material.

11. The method according to claim 1, wherein the protective layer is composed of a material that screens out ultraviolet rays.

* * * * *